(12) United States Patent
Koezuka (10) Patent No.: US 8,877,607 B2
(45) Date of Patent: Nov. 4, 2014

(54) METHOD FOR MANUFACTURING SOI SUBSTRATE

(75) Inventor: Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 191 days.

(21) Appl. No.: 13/346,930

(22) Filed: Jan. 10, 2012

(65) Prior Publication Data

US 2012/0184085 A1    Jul. 19, 2012

(30) Foreign Application Priority Data

Jan. 14, 2011   (JP) .................................. 2011-005490

(51) Int. Cl.
*H01L 21/762*    (2006.01)

(52) U.S. Cl.
CPC ................................ *H01L 21/76254* (2013.01)
USPC ............... 438/458; 257/E21.46; 257/E21.568

(58) Field of Classification Search
USPC ............. 257/E21.46, E21.568; 438/440, 455, 438/458, 506, 514, 527, 528, 766
See application file for complete search history.

(56) References Cited

U.S. PATENT DOCUMENTS

| | | |
|---|---|---|
| 6,372,609 B1 | 4/2002 | Aga et al. |
| 6,583,440 B2 | 6/2003 | Yasukawa |
| 6,818,921 B2 | 11/2004 | Yasukawa |
| 7,112,514 B2 | 9/2006 | Yasukawa |
| 7,563,319 B2 | 7/2009 | Umeno et al. |
| 2002/0089032 A1 | 7/2002 | Huang |
| 2005/0115642 A1* | 6/2005 | Fukuda et al. ............... 148/33.5 |
| 2012/0034758 A1 | 2/2012 | Koezuka |
| 2012/0178238 A1 | 7/2012 | Sekiguchi et al. |

FOREIGN PATENT DOCUMENTS

| | | |
|---|---|---|
| EP | 1 045 448 | 10/2000 |
| JP | 2000-124092 | 4/2000 |
| JP | 2002-170942 | 6/2002 |

OTHER PUBLICATIONS

Eichhorn et al., Strain and SiC Particle Formation in Silicon Implanted with Carbon Ions of Medium Fluence Studied by Synchrotron X-Ray Diffraction, Journal of Applied Physics, vol. 86 (8), p. 4184-4187 (1999).*

* cited by examiner

*Primary Examiner* — Asok K Sarkar
(74) *Attorney, Agent, or Firm* — Eric J. Robinson; Robinson Intellectual Property Law Office, P.C.

(57) ABSTRACT

To suppress desorption of hydrogen ions with which a single crystal semiconductor substrate is irradiated. A method for manufacturing an SOI substrate includes the following steps: irradiating a semiconductor substrate with carbon ions; irradiating the semiconductor substrate with a hydrogen ion after the irradiation with the carbon ion so as to form an embrittled region in the semiconductor substrate; disposing a surface of the semiconductor substrate and a surface of a base substrate to face each other and to be in contact with each other so that the semiconductor substrate and the base substrate are bonded; and heating the semiconductor substrate and the base substrate which are bonded to each other and separating the semiconductor substrate along the embrittled region so that a semiconductor layer is formed over the base substrate.

6 Claims, 6 Drawing Sheets

METHOD FOR MANUFACTURING SOI SUBSTRATE

BACKGROUND OF THE INVENTION

1. Field of the Invention

One embodiment of the disclosed invention relates to a method for manufacturing an SOI substrate.

2. Description of the Related Art

In recent years, an integrated circuit using an SOI (silicon on insulator) substrate in which a thin single crystal semiconductor layer is formed on an insulating surface, instead of a bulk silicon wafer, has been developed. The use of an SOI substrate can reduce parasitic capacitance between a drain of a transistor and a substrate; thus, SOI substrates are attracting attention for their ability to improve performance of semiconductor integrated circuits.

One of known methods for manufacturing SOI substrates is a hydrogen ion implantation separation method (for example, see Patent Document 1). A summary of a method for manufacturing an SOI substrate by a hydrogen ion implantation separation method is as follows. First, hydrogen ions are implanted into a silicon wafer by an ion implantation method to form a micro-bubble layer at a predetermined depth from the surface. Next, the silicon wafer into which hydrogen ions have been implanted is bonded to another silicon wafer with a silicon oxide film interposed therebetween. Then, by heat treatment, the micro-bubble layer serves as a cleavage plane and a part of the silicon wafer into which hydrogen ions have been implanted is separated in a thin film shape along the micro-bubble layer. Accordingly, a single crystal silicon film can be formed over the other bonded silicon wafer.

A method for forming a single crystal silicon layer over a base substrate made from glass by using such a hydrogen ion implantation method as described above has been proposed (for example, see Patent Document 2). Since a glass substrate can have a larger area and is less expensive than a silicon wafer, by using a glass substrate as a base substrate, an inexpensive large-sized SOI substrate can be manufactured.

A single crystal semiconductor substrate is irradiated with accelerated hydrogen ions, whereby implantation of the hydrogen ions or doping with the hydrogen ions is performed on the single crystal semiconductor substrate at a predetermined depth to form an embrittled region there. Then, heat treatment is performed. Through the heat treatment, hydrogen contained in the embrittled region is vaporized and further the hydrogen is expanded, so that a cleavage plane is formed in the embrittled region.

REFERENCE

Patent Documents

[Patent Document 1] Japanese Published Patent Application No. 2000-124092

[Patent Document 2] Japanese Published Patent Application No. 2002-170942

SUMMARY OF THE INVENTION

However, not all the hydrogen ions used for the irradiation contribute to the separation. The hydrogen ions used for the irradiation are diffused in a silicon wafer during the irradiation or during heat treatment for the separation, and part of the hydrogen ions are desorbed from the silicon wafer. Thus, a larger number of hydrogen ions than that needed for the separation are required for the irradiation.

When the hydrogen ions used for the irradiation are diffused in the silicon wafer, concentration distribution of hydrogen ions in the silicon wafer is uneven. This uneven concentration distribution of hydrogen ions in the silicon wafer causes a problem of an increase in surface unevenness of a semiconductor layer over a base substrate from which a part of the silicon wafer is separated.

In the case where heat treatment such as laser irradiation or the like is performed to recover crystallinity of the semiconductor layer over the base substrate from which the part of the silicon wafer is separated, there is a possibility that a defect, dislocation, or the like remains in the semiconductor layer irradiated with a large number of hydrogen ions even after the heat treatment and crystallinity is not recovered sufficiently. If a semiconductor device is manufactured using a semiconductor layer of which crystallinity is not recovered, characteristics of the semiconductor device may be degraded.

Further, in the case where the surface unevenness of the semiconductor layer over the base substrate from which the part of the silicon wafer is separated increases as described above, a void may be produced on the surface of the semiconductor layer when the heat treatment such as laser irradiation or the like is performed.

In view of the foregoing, an object of one embodiment of the disclosed invention is to suppress desorption of hydrogen ions with which a single crystal semiconductor substrate is irradiated.

Further, an object of one embodiment of the disclosed invention is to obtain an SOI substrate having a semiconductor layer with high crystallinity.

Furthermore, an object of one embodiment of the disclosed invention is to obtain an SOI substrate having a semiconductor layer with less surface unevenness.

In one embodiment of the disclosed invention, by irradiating the single crystal semiconductor substrate with carbon ions which control diffusion of hydrogen ions, desorption of hydrogen ions injected into the single crystal semiconductor substrate is suppressed.

The diffusion of hydrogen in crystalline silicon is accelerated by combination with excess interstitial silicon introduced by ion implantation or the like. Carbon is easily combined with such interstitial silicon; thus, diffusion of hydrogen can be suppressed.

One embodiment of the disclosed invention relates to a method for manufacturing an SOI substrate, which includes the steps of: irradiating a semiconductor substrate with carbon ions; irradiating the semiconductor substrate with hydrogen ions after the irradiation with the carbon ions so as to form an embrittled region in the semiconductor substrate; disposing a surface of the semiconductor substrate and a surface of a base substrate to face each other and to be in contact with each other so that the semiconductor substrate and the base substrate are bonded; and heating the semiconductor substrate and the base substrate which are bonded to each other and separating the semiconductor substrate along the embrittled region so that a semiconductor layer is formed over the base substrate.

In one embodiment of the disclosed invention, the maximum value of the carbon concentration and the maximum value of the hydrogen concentration in the semiconductor substrate are located at the same depth, or the maximum value of the carbon concentration is located at a shallower depth than the maximum value of the hydrogen concentration.

In one embodiment of the disclosed invention, an insulating layer is formed over the semiconductor substrate, and the semiconductor substrate over which the insulating layer is formed is irradiated with the carbon ions.

In one embodiment of the disclosed invention, an insulating layer is formed over the semiconductor substrate irradiated with the carbon ions.

One embodiment of the disclosed invention relates to a method for manufacturing an SOI substrate, which includes the steps of: irradiating a semiconductor substrate with cluster ions including carbon and hydrogen to form an embrittled region in the semiconductor substrate; disposing a surface of the semiconductor substrate and a surface of a base substrate to face each other and to be in contact with each other so that the semiconductor substrate and the base substrate are bonded; and heating the semiconductor substrate and the base substrate which are bonded to each other and separating the semiconductor substrate along the embrittled region so that a semiconductor layer is formed over the base substrate.

In one embodiment of the disclosed invention, the maximum value of the carbon concentration and the maximum value of the hydrogen concentration in the semiconductor substrate are located at the same depth, or the maximum value of the carbon concentration is located at a shallower depth than the maximum value of the hydrogen concentration.

In one embodiment of the disclosed invention, the semiconductor substrate is irradiated with hydrogen ions after being irradiated with the cluster ions including carbon and hydrogen.

In one embodiment of the disclosed invention, an insulating layer is formed over the semiconductor substrate, and the semiconductor substrate over which the insulating layer is formed is irradiated with the cluster ions including carbon and hydrogen.

In one embodiment of the disclosed invention, an insulating layer is formed over the semiconductor substrate irradiated with the cluster ions including carbon and hydrogen.

In general, the term "SOI substrate" means a semiconductor substrate in which a silicon layer is provided over an insulating surface. In this specification and the like, the term "SOI substrate" also includes a semiconductor substrate in which a semiconductor layer formed using a material other than silicon is provided over an insulating surface in its category. That is, a semiconductor layer included in the "SOI substrate" is not limited to a silicon layer. In addition, in this specification and the like, a semiconductor substrate means not only a substrate formed using only a semiconductor material but also all substrates including a semiconductor material. Namely, in this specification and the like, the "SOI substrate" is also included in the category of a semiconductor substrate.

Note that in this specification and the like, the term "single crystal" means a crystal in which, when a certain crystal axis is focused, the direction of the crystal axis is oriented in a similar direction in any portion of a sample. That is, the single crystal includes a crystal in which the direction of crystal axes is uniform as described above even when it includes a crystal defect or a dangling bond.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light-emitting display device, a liquid crystal display device, and a display device including an electrophoretic element. A light-emitting device includes a light-emitting element, and a liquid crystal display device includes a liquid crystal element. A light-emitting element includes, in its scope, an element whose luminance is controlled by a current or a voltage, and specifically includes an inorganic electroluminescent (EL) element, an organic EL element, and the like.

Note that the ordinal numbers such as "first", "second", and "third" in this specification are used for convenience and do not denote the order of steps and the stacking order of layers. In addition, the ordinal numbers in this specification do not denote particular names which specify the present invention.

According to one embodiment of the disclosed invention, desorption of hydrogen ions with which a single crystal semiconductor substrate is irradiated can be prevented.

Further, according to one embodiment of the disclosed invention, an SOI substrate having a semiconductor layer with high crystallinity can be obtained.

Furthermore, according to one embodiment of the disclosed invention, an SOI substrate having a semiconductor layer with less surface unevenness can be obtained.

DETAILED DESCRIPTION OF THE INVENTION

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof will be omitted.

Embodiment 1

First, a semiconductor substrate 110 is prepared as a bond substrate. A polycrystalline semiconductor substrate or a single crystal semiconductor substrate can be used as the semiconductor substrate 110. As the semiconductor substrate 110, for example, a semiconductor substrate that is formed of an element which belongs to Group 14, such as a polycrystalline or single crystal silicon substrate, a polycrystalline or single crystal germanium substrate, a polycrystalline or single crystal silicon germanium substrate, or a polycrystalline or single crystal silicon carbide substrate; or a polycrystalline or single crystal compound semiconductor substrate using gallium arsenide, indium phosphide, or the like can be given. The size of a silicon substrate is typically 5 inches (125 mm) in diameter, 6 inches (150 mm) in diameter, 8 inches (200 mm) in diameter, and 12 inches (300 mm) in diameter, and a typical shape thereof is a circular shape. Note that the shape of the silicon substrate is not limited to the circular shape, and a silicon substrate processed to have a rectangular shape or the like can also be used. Note that unless otherwise specified, a rectangular shape includes a square. The case where a single crystal silicon substrate (silicon wafer) processed to have a rectangular shape is used as the semiconductor substrate 110 will be described below.

Further, a base substrate 100 is prepared. As the base substrate 100, a light-transmitting glass substrate used for a liquid crystal display device or the like can be used. As the glass substrate, the one whose strain point is 600° C. or more is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example. With use of a glass substrate which can have a large area and is inexpensive as the base substrate 100, a cost can be reduced more than in the case of using a silicon wafer.

Further, as the base substrate 100, a substrate which is formed of an insulator, such as a ceramic substrate, a quartz substrate, or a sapphire substrate; a semiconductor substrate such as silicon; a substrate which is formed of a conductor such as metal or stainless steel; or the like can be used. Furthermore, as the base substrate 100, a plastic substrate having heat resistance to withstand process temperature in manufacturing steps may also be used. The case where a glass substrate processed to have a rectangular shape is used as the base substrate 100 will be described below.

Note that an insulating layer 101 is formed on the base substrate 100. There is no particular limitation on the method of forming the insulating layer 101, and a sputtering method, a plasma CVD method, or the like can be employed, for example. Since the insulating layer 101 has a surface to be bonded, the insulating layer 101 is preferably formed such that this surface has high planarity. The insulating layer 101 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, when silicon oxide is used to form the insulating layer 101, formation using an organosilane gas by a chemical vapor deposition method enables the insulating layer 101 to have excellent planarity. Note that although the insulating layer 101 has a single layer structure in this embodiment, it may have a stack structure. Further, when the insulating layer 101 is not necessarily provided, for example, when there is no particular problem with the bonding, a structure in which the insulating layer 101 is not provided may be employed.

Figure 2A:
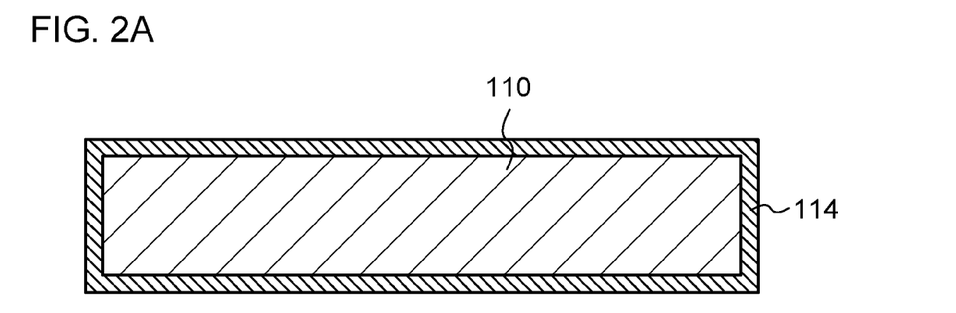
FIGS. 2A to 2C are cross-sectional views illustrating manufacturing steps of an SOI substrate.

Next, an insulating layer 114 is formed on the semiconductor substrate 110 (see FIG. 2A).

As the insulating layer 114, a single layer of a silicon oxide layer, a silicon oxynitride layer, a silicon nitride layer, a silicon nitride oxide layer, or the like or a stack of these layers can be used. These layers can be formed by a CVD method, a sputtering method, or the like. When a CVD method is employed to form the insulating layer 114, the use of a silicon oxide layer formed using organosilane, such as tetraethylorthosilicate (abbreviation: TEOS) (chemical formula: $Si(OC_2H_5)_4$), as the insulating layer 114 is preferable in terms of productivity.

Note that a silicon oxynitride layer refers to a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide layer refers to a layer which contains more nitrogen than oxygen, and in the case where measurements are performed using RBS and HFS, contains oxygen, nitrogen, silicon, and hydrogen at concentrations ranging from 5 to 30 at. %, 20 to 50 at. %, 25 to 35 at. %, and 15 to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Alternatively, the insulating layer 114 may be formed by performing thermal oxidation treatment on the semiconductor substrate 110. In this case, the thermal oxidation treatment is preferably performed in an oxidation atmosphere to which halogen is added. As an example of such thermal oxidation treatment, it is preferable that thermal oxidation treatment be performed in an atmosphere containing hydrogen chloride (HCl) at 0.5 vol. % to 10 vol. % (preferably, 3 vol. %) with respect to oxygen at a temperature of 900° C. to 1150° C. (for example, 950° C.). Processing time may be 0.1 to 6 hours, preferably 0.5 to 1 hour. The thickness of an oxide layer to be formed is 10 nm to 1000 nm (preferably, 50 nm to 200 nm), for example, 100 nm.

In this embodiment, the semiconductor substrate 110 is subjected to thermal oxidation treatment in an atmosphere containing hydrogen chloride (HCl), so that the insulating layer 114 (here, a silicon oxide layer) is formed. Accordingly, the insulating layer 114 includes chlorine atoms.

In this embodiment, the insulating layer 114 is formed entirely on the semiconductor substrate 110; however, the insulating layer 114 may be formed only on the surface (that is, a surface irradiated with carbon ions 102 and hydrogen ions 103 in a later step) to be bonded to the base substrate 100. Further, when the insulating layer 114 is not necessarily provided, for example, when there is no particular problem with the bonding, a structure in which the insulating layer 114 is not provided may be employed.

Figure 2B:
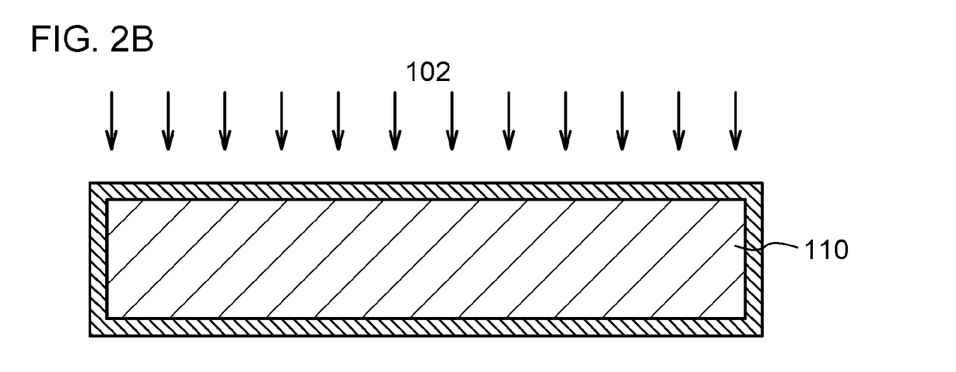

Next, the semiconductor substrate 110 on which the insulating layer 114 is formed is irradiated with the carbon ions 102 (see FIG. 2B).

Figure 1A:
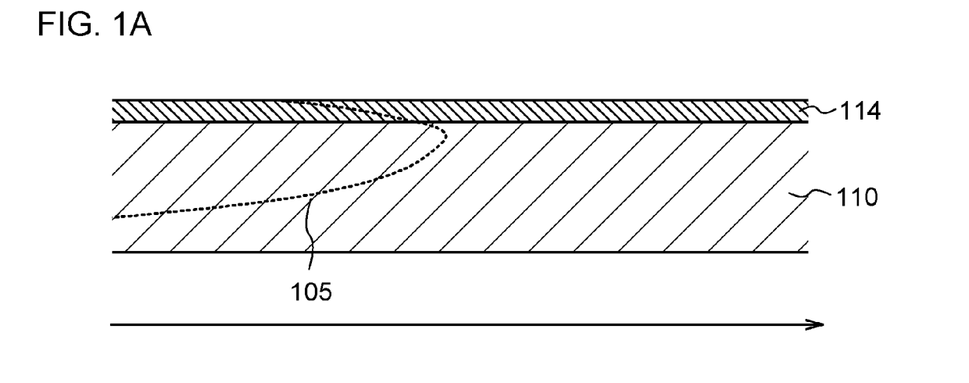
FIGS. 1A to 1C are cross-sectional views illustrating manufacturing steps of an SOI substrate.

Concentration distribution of carbon in the semiconductor substrate 110 is shown in FIG. 1A. The carbon concentration in the semiconductor substrate 110 shown by a curve 105 in FIG. 1A has the maximum value at a predetermined depth. Note that arrows in FIGS. 1A to 1C indicate the levels of the carbon concentration and hydrogen concentration. The carbon concentration and the hydrogen concentration increase in the direction indicated by arrows in FIGS. 1A to 1C.

An ion implantation apparatus or an ion doping apparatus can be used to add the carbon ions 102 to the semiconductor substrate 110. In the ion implantation apparatus, a source gas is excited to generate ion species, the generated ion species are mass-separated, and an object to be processed is irradiated with the ion species having a predetermined mass. In an ion doping apparatus, a process gas is excited to produce ion species, the produced ion species are not mass-separated, and an object to be processed is irradiated with the produced ion species.

A carbon ion irradiation step in the case of using an ion doping apparatus can be performed under the following conditions, for example.

An acceleration voltage is higher than or equal to 10 keV and lower than or equal to 100 keV, for example, 90 keV.

A dose is higher than or equal to $1 \times 10^{14}$ ions/cm$^2$ and lower than or equal to $2 \times 10^{16}$ ions/cm$^2$, for example, $1 \times 10^{15}$ ions/cm$^2$.

When an ion doping apparatus is used, a gas containing carbon is used as a source gas. Using the gas containing carbon, $C^+$ can be produced as ion species. Further, irradiation with the carbon ions 102 may be performed in plural times.

In this embodiment, the irradiation with the carbon ions 102 is performed after forming the insulating layer 114; however, timing of the irradiation is not limited thereto. The semiconductor substrate 110 may be irradiated with the carbon ions 102 before forming the insulating layer 114. However, in the case where a thermal oxidation film is formed as the insulating layer 114 by performing thermal oxidation treatment on the semiconductor substrate 110, irradiation with the carbon ions 102 is performed after forming the thermal oxidation film. This is because carbon in the semiconductor substrate 110 is diffused by thermal oxidation treatment if the thermal oxidation treatment is performed after the irradiation with the carbon ions 102.

Figure 2C:
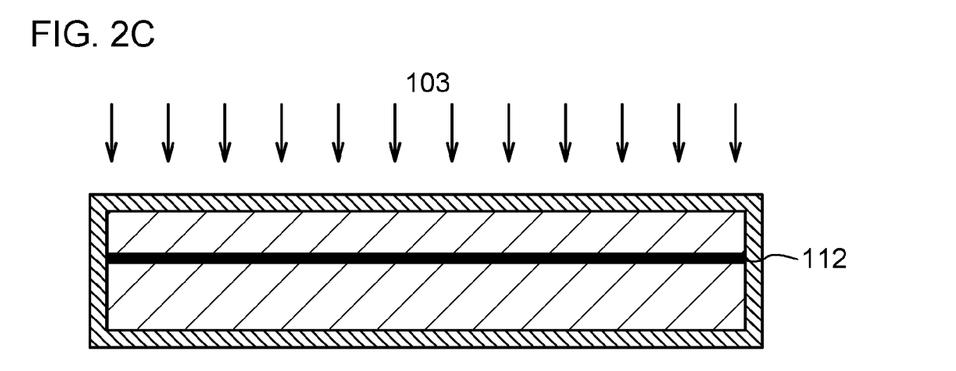

Next, the semiconductor substrate 110 on which the insulating layer 114 is formed is irradiated with the hydrogen ions 103, so that an embrittled region 112 is formed in the semiconductor substrate 110 (see FIG. 2C). For example, the semiconductor substrate 110 is irradiated with an ion beam including the accelerated hydrogen ions 103, so that the embrittled region 112 is formed at a predetermined depth from the surface of the semiconductor substrate 110. The depth at which the embrittled region 112 is formed is controlled by the accelerating energy of the ion beam and the incidence angle thereof. In other words, the embrittled region 112 is formed in a region at the same or substantially the same depth as the average penetration depth of the hydrogen ions 103. Here, the depth at which the embrittled region 112 is formed is preferably uniform from a surface of the semiconductor substrate 110.

Further, the depth at which the above-described embrittled region 112 is formed determines the thickness of the semiconductor layer which is to be separated from the semiconductor substrate 110. The depth at which the embrittled region 112 is formed is greater than or equal to 50 nm and less than or equal to 1 μm, preferably greater than or equal to 50 nm and less than or equal to 300 nm from the surface of the semiconductor substrate 110.

Figure 1B:
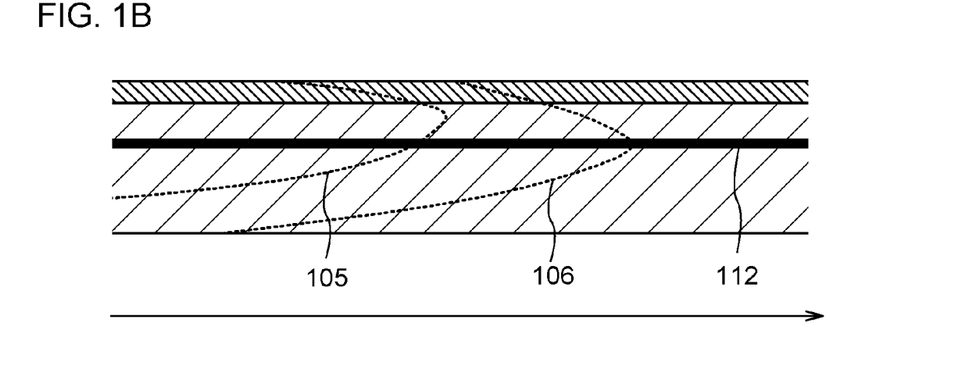

Concentration distribution of hydrogen in the semiconductor substrate 110 is shown in FIG. 1B. The carbon concentration in the semiconductor substrate 110 shown by a curve 106 in FIG. 1B has the maximum value at a predetermined depth. Further, it is desirable that the maximum values of carbon concentration and hydrogen concentration be located at the same depth, or the maximum value of carbon concentration be located at a shallower depth than the maximum value of hydrogen concentration (that is, the maximum value of carbon concentration is closer to the surface of the semiconductor substrate 110). It is preferable that the maximum value of the carbon concentration be located at a shallower depth than the maximum value of hydrogen concentration because diffusion of hydrogen ions on the surface side of semiconductor substrate 110 can be controlled.

At the time of irradiating the semiconductor substrate 110 with the hydrogen ions 103, an ion implantation apparatus or an ion doping apparatus can be used. In an ion implantation apparatus, a source gas is excited to generate ion species, the generated ion species are mass-separated, and an object to be processed is irradiated with the ion species having a predetermined mass. In an ion doping apparatus, a process gas is excited to produce ion species, the produced ion species are not mass-separated, and a process object is irradiated with the produced ion species.

In the case of using an ion doping apparatus, a process for forming the embrittled region 112 can be performed, for example, under the following conditions:

An acceleration voltage is higher than or equal to 10 keV and lower than or equal to 100 keV, for example, 50 keV.

A dose is higher than or equal to $5\times10^{15}$ ions/cm$^2$ and lower than or equal to $4\times10^{16}$ ions/cm$^2$, for example, $1\times10^{16}$ ions/cm$^2$.

Carbon is added to the semiconductor substrate 110 in the previous step; thus, hydrogen that is added is not desorbed from the semiconductor substrate 110. Accordingly, a dose of the hydrogen ions 103 can be reduced compared to the case where carbon is not added.

Beam current density is greater than or equal to 2 μA/cm$^2$ (preferably, greater than or equal to 5 μA/cm$^2$, and more preferably, greater than or equal to 10 μA/cm$^2$)

When an ion doping apparatus is used, a gas containing hydrogen can be used as a source gas. By using a gas containing hydrogen, $H^+$, $H_2^+$, and $H_3^+$ ions can be produced as ion species. In the case where the gas containing hydrogen is used as a source gas, it is preferable to perform irradiation with a larger number of $H_3^+$ ions. Specifically, the proportion of $H_3^+$ ions which are included in the ion beam is preferably greater than or equal to 70% with respect to the total amount of $H^+$, $H_2^+$, and $H_3^+$; more preferably, the proportion of $H_3^+$ ions is greater than or equal to 80%. It is more preferable that the proportion of $H_3^+$ ions be higher than or equal to 80%. By increasing the proportion of $H_3^+$ ions in this manner, the embrittled region 112 can contain hydrogen at a concentration of higher than or equal to $1\times10^{21}$ atoms/cm$^3$. Accordingly, separation at the embrittled region 112 can be easily performed. Furthermore, with the irradiation with a large number of $H_3^+$ ions, the embrittled region 112 can be formed in a shorter period of time as compared with the case of irradiation with $H^+$ ions and $H_2^+$ ions. Moreover, with the use of $H_3^+$, the average penetration depth of ions can be made shallower; thus, the embrittled region 112 can be formed at a shallower region.

In the case of using an ion implantation apparatus, it is preferable to perform irradiation with $H_3^+$ through mass separation. Of course, irradiation with $H^+$ or $H_2^+$ may be performed. Note that, since ion species are selected to perform irradiation in the case of using an ion implantation apparatus, ion irradiation efficiency is decreased compared to the case of using an ion doping apparatus, in some cases.

Further, the irradiation with the hydrogen ions 103 may be performed plural times to form the embrittled region 112. In this case, different source gases may be used for ion irradiation or the same source gas may be used for the ion irradiation. For example, ion irradiation can be performed using a gas containing hydrogen as a source gas after ion irradiation is performed using a rare gas as a source gas. Also, ion irradiation is performed first using a halogen gas or a halogen compound gas, and then ion irradiation can be performed using a gas containing hydrogen.

Figure 3A:
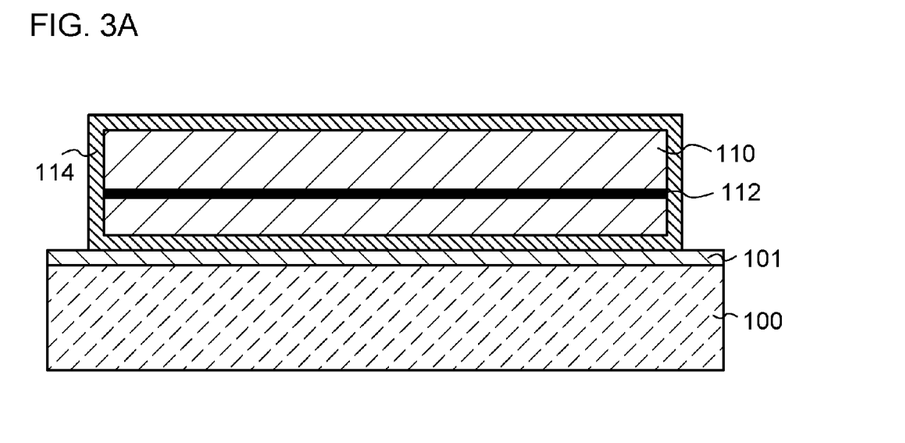
FIGS. 3A to 3C are cross-sectional views illustrating manufacturing steps of an SOI substrate.

Next, the base substrate 100 and the semiconductor substrate 110 are bonded to each other (see FIG. 3A). Specifically, the surface of the base substrate 100 and the surface of the semiconductor substrate 110 are disposed to face each other, and the insulating layer 101 formed over the base substrate 100 and the insulating layer 114 formed on the semiconductor substrate 110 are bonded to each other.

Note that before the bond substrate 110 and the base substrate 100 are bonded to each other, at least one of the insulating layer 114 formed on the semiconductor substrate 110 and the insulating layer 101 formed over the base substrate 100 is preferably subjected to surface treatment. By the surface treatment, bonding strength at the bonding interface between the semiconductor substrate 110 and the base substrate 100 can be improved. Moreover, surface treatment can reduce particles (also referred to as dust) or the like on the substrate, so that bonding defects due to the particles or the like can be suppressed. Note that if the insulating layer 101 is not provided on the base substrate 100, the surface of the base substrate 100 is preferably subjected to surface treatment, and if the insulating layer 114 is not provided on the semiconductor substrate 110, the surface of the semiconductor substrate 110 is preferably subjected to surface treatment.

As examples of the surface treatment, wet treatment, dry treatment, and a combination of both are given. Alternatively, a combination of different types of wet treatments or a combination of different types of dry treatments can be employed.

When the base substrate 100 is bonded to the semiconductor substrate 110, one of or both the base substrate 100 and the semiconductor substrate 110 are heated, so that defects due to the bonding interface between the base substrate 100 and the semiconductor substrate 110 can be suppressed. When the base substrate 100 is heated, the heating temperature of the base substrate 100 is higher than or equal to 50° C. and lower than or equal to 100° C., preferably higher than or equal to 55° C. and lower than or equal to 95° C. There is no particular limitation on the heating time, which is set as appropriate so that the base substrate 100 reaches a desired temperature. For example, the base substrate 100 can be heated for 180 seconds.

Next, the base substrate 100 heated to a desired temperature is pressed, whereby an end portion of the base substrate 100 is in contact with an end portion of the semiconductor substrate 110. Alternatively, with the use of a pin or the like, a point of the base substrate 100 or the semiconductor substrate 110, for example, a central portion of the base substrate 100 is pressed, whereby the base substrate 100 may be in contact with the semiconductor substrate 110. The base substrate 100 and the semiconductor substrate 110 start to be bonded to each other from a portion where they are in contact with each other. The bonding progresses concentrically from the start point. For example, when the bonding starts from one of the corner portions of the base substrate 100 and the semiconductor substrate 110, the bonding progresses concentrically toward the opposite corner of the corner portion and extends all over the surface.

Next, after the semiconductor substrate 110 and the base substrate 100 are bonded to each other, the semiconductor substrate 110 and the base substrate 100 that are bonded to each other are preferably subjected to heat treatment so that the bonding is strengthened. The heat temperature at this time is preferably a temperature that does not promote separation at the embrittled region 112. For example, the temperature is set to lower than 400° C., preferably lower than or equal to 300° C. Heat treatment time is not particularly limited and may be optimally set as appropriate depending on the relation between processing time and bonding strength. The heat treatment can be performed using a heating furnace such as a diffusion furnace or a resistance heating furnace, a rapid thermal annealing (RTA) apparatus, or the like. Further, only the region for bonding can be locally heated by irradiation with microwaves or the like. When the substrates have no attachment strength problems, the heat treatment may be omitted. In this embodiment, the heat treatment is performed at 200° C. for two hours.

Figure 3B:
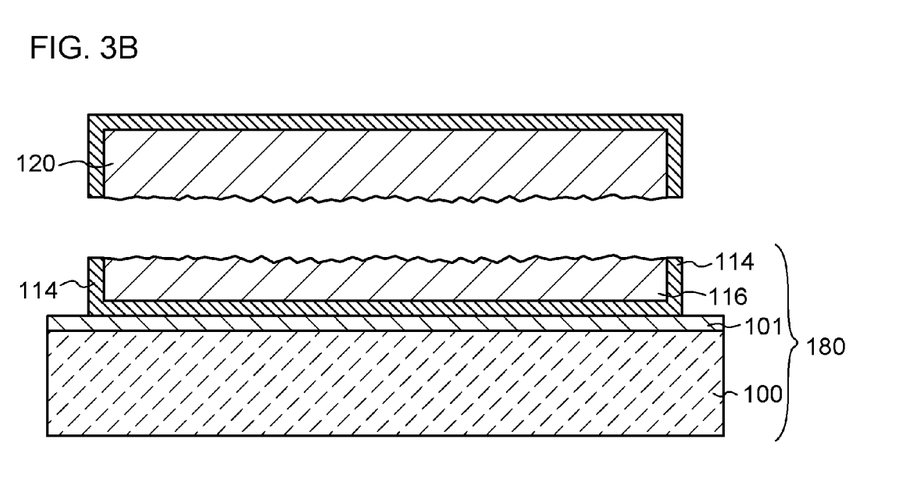

Next, by performing heat treatment again, the semiconductor substrate 110 is separated into a semiconductor layer 116 and a semiconductor substrate 120 along the embrittled region 112 (see FIG. 3B). Through the above steps, an SOI substrate 180 in which the semiconductor layer 116 is provided over the base substrate 100 with the insulating layer 114 interposed therebetween can be obtained.

When the heat treatment is performed, added hydrogen atoms are separated out into micro-voids which are formed in the embrittled region 112 by an increase in temperature, and internal pressure of the micro-voids is increased. By the increase in pressure, the volume of the micro-voids in the embrittled region 112 changes, so that hydrogen micro-bubbles 107 grow (see FIG. 1C).

Figure 1C:
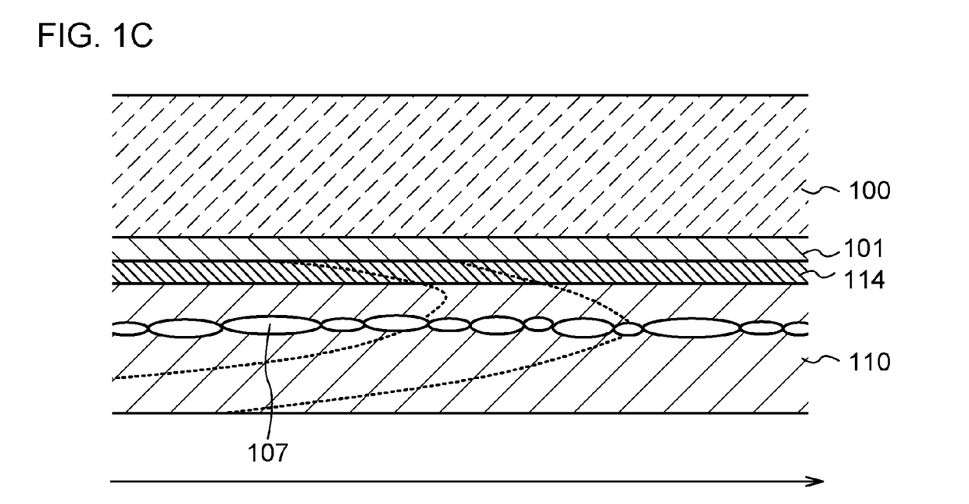

In this embodiment, the semiconductor substrate 110 is irradiated with the carbon ions 102; thus, diffusion of hydrogen is suppressed. Accordingly, even in the case of a low dose of hydrogen, the hydrogen micro-bubbles 107 can grow effectively.

The grown micro-bubbles 107 form a micro-bubble layer, and a part of the semiconductor substrate 110 is separated from the semiconductor substrate 110 along the micro-bubble layer. Since the insulating layer 114 and the base substrate 100 are bonded to each other, the semiconductor layer 116 which is separated from the semiconductor substrate 110 is formed over the base substrate 100 with the insulating layer 114 interposed therebetween. Further, here, the temperature in the heat treatment is set so as not to exceed the strain point of the base substrate 100. In the case of using a glass substrate as the base substrate 100, for example, heat treatment temperature is preferably set to be higher than or equal to 400° C. and lower than or equal to 750° C. However, the heat treatment temperature is not limited thereto as long as the glass substrate can withstand heat. For this heat treatment, a diffusion furnace, a heating furnace such as a resistance heating furnace, a rapid thermal annealing (RTA) apparatus, a microwave heating apparatus, or the like can be used. Note that in this embodiment, the heat treatment is performed at 600° C. for two hours.

The carbon added to the semiconductor substrate 110 also suppresses the diffusion of hydrogen in the depth direction (the direction perpendicular to the surface of the semiconductor substrate 110). Thus, the width of the micro-bubble layer in the depth direction is reduced when carbon is added to the semiconductor substrate 110. Consequently, when the part of the semiconductor substrate 110 is separated from the semiconductor substrate 110 along the micro-bubble layer, surface unevenness of the part (semiconductor layer) of the semiconductor substrate 110 can be reduced.

Note that without performing the above-described heat treatment for increasing the bonding strength between the base substrate 110 and the semiconductor substrate 100, a heat treatment step for increasing the bonding strength between the base substrate 100 and the insulating layer 114 and a heat treatment step for separation along the embrittled region 112 may be performed at the same time.

Further, if necessary, planarization treatment is performed on the semiconductor layer 116 in the SOI substrate 180. Even when unevenness or a defect due to the separation step or the ion irradiation step is caused on the surface of the semiconductor layer 116, by performing the planarization treatment on the SOI substrate 180, the surface of the semiconductor layer 116 can be planarized.

The planarization treatment can be performed by chemical mechanical polishing (CMP), etching treatment, laser light irradiation, or the like. Here, by irradiating the semiconductor layer 116 with laser light, the semiconductor layer 116 is recrystallized and its surface is planarized.

In this embodiment, the surface unevenness on the part (semiconductor layer) of the semiconductor substrate 110 can be reduced as described above; thus, there is no possibility that a void may be produced on the surface of the semiconductor layer 116 even when laser irradiation is performed.

The semiconductor layer 116 is irradiated with laser light from the upper surface side so that the upper surface of the semiconductor layer 116 is melted. After the upper surface thereof is melted, the semiconductor layer 116 is cooled and solidified, so that a semiconductor layer 118 having the upper surface whose planarity is improved can be obtained. By using laser light, the base substrate 100 is not directly heated, and the temperature rise of the base substrate 100 can be suppressed. Therefore, a substrate with low heat-resistance such as a glass substrate can be used as the base substrate 100.

Note that it is preferable that the semiconductor layer 116 be partially melted by laser light irradiation. This is because, if the semiconductor layer 116 is completely melted, it is micro-crystallized due to random nucleation after being changed into a liquid phase, so that crystallinity of the semiconductor layer 116 is highly likely to be decreased. On the other hand, by partial melting, crystal growth proceeds from a non-melted solid phase part. Accordingly, defects in the semiconductor layer 116 can be reduced. Note that "complete melting" herein means that the semiconductor layer 116 is melted into a liquid state down to the vicinity of its lower interface. On the other hand, in this case, the term "partial melting" means that the upper part of the semiconductor layer 116 is melted and is in a liquid phase while the lower part thereof is not melted and is still in a solid phase.

According to this embodiment, the dose of the hydrogen ions 103 can be reduced, whereby hydrogen concentration in the semiconductor layer 116 is low. Thus, by irradiating the semiconductor layer 116 with laser light, the semiconductor layer 118 with high crystallinity can be obtained.

A pulsed laser is preferably used for the laser irradiation. This is because high-energy pulsed laser light can be emitted instantaneously and a partial melting state can be easily obtained. The repetition rate is preferably about greater than or equal to 1 Hz and less than or equal to 10 MHz.

After the above-described laser irradiation, a process of reducing the thickness of the semiconductor layer 118 may be performed. The semiconductor layer 118 may be thinned by etching treatment (etch-back treatment) by either dry etching or wet etching or by both in combination. For example, in the case where the semiconductor layer 118 is formed using a silicon material, the semiconductor layer 118 can be thinned by dry etching using $SF_6$ and $O_2$ as a process gas.

Note that planarization treatment may also be performed on the semiconductor substrate 120 which has been separated, in addition to the SOI substrate 180. By planarizing the surface of the semiconductor substrate 120 which has been separated, the semiconductor substrate 120 can be reused in manufacturing steps of the SOI substrate.

Figure 3C:
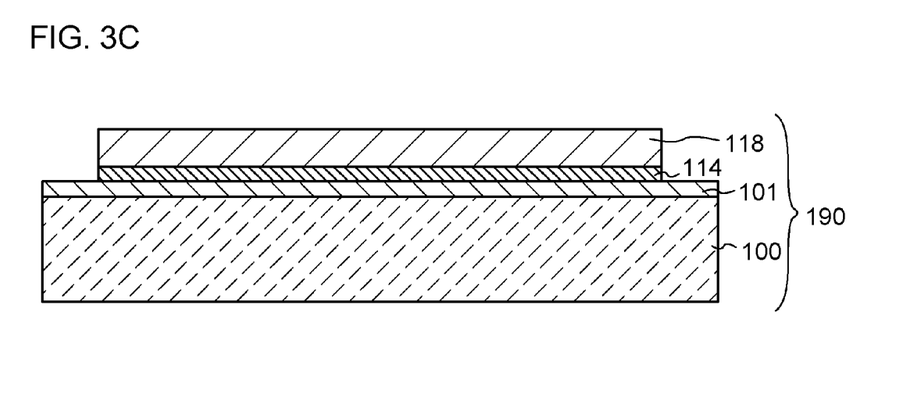

Through the above steps, an SOI substrate 190 in which the semiconductor layer 118 is provided over the base substrate 100 with the insulating layer 114 interposed therebetween can be manufactured (see FIG. 3C).

Note that although the case where the laser light irradiation on the semiconductor layer 116 precedes the etching treatment in this embodiment, one embodiment of the disclosed invention is not limited thereto. The etching treatment may be performed before the laser light irradiation, or both before and after the laser light irradiation.

Note that although laser light is used to achieve the reduction in defects and the improvement of the planarity in this embodiment, one embodiment of the present invention is not limited thereto. The reduction in defects and the improvement in planarity may be achieved by using any other method such as heat treatment. Even when defects are reduced and the planarity is improved by the heat treatment, it is effective to reduce bonding defects caused by surplus moisture by performing the heat treatment on at least one of the base substrate 100 and the semiconductor substrate 110. Further, when treatment for reducing defects is unnecessary, treatment for improving planarity, such as etching treatment, may be employed alone.

As described above, according to this embodiment, desorption of the hydrogen ions 103 with which the semiconductor substrate 110 is irradiated can be prevented.

Further, the desorption of the hydrogen ions 103 from the semiconductor substrate 110 can be suppressed, whereby the dose of the hydrogen ions 103 that is used for the irradiation can be reduced.

Furthermore, according to this embodiment, the SOI substrate 190 having the semiconductor layer 118 with high crystallinity can be obtained.

Moreover, according to this embodiment, the SOI substrate 190 having the semiconductor layer 118 with less surface unevenness can be obtained.

Embodiment 2

In this embodiment, a method for manufacturing an SOI substrate, which is different from that shown in Embodiment 1 will be described. Only an aspect different from Embodiment 1 is described in this embodiment. A portion which is not described in this embodiment follows the description in Embodiment 1.

In this embodiment, instead of the carbon ions 102 described in Embodiment 1, cluster ions ($CH_xH_y^+$) including carbon and hydrogen are used for the irradiation. In the case where the cluster ions ($CH_xH_y^+$) including carbon and hydrogen are used, carbon and hydrogen can be added at the same time; thus, the hydrogen micro-bubbles 107 can be formed further effectively.

In the case where the semiconductor substrate 110 is irradiated with the cluster ions including carbon and hydrogen, for example, a dose of the cluster ions may be $1 \times 10^{15}$ ions/$cm^2$. The acceleration voltage is changed depending on the value of x. For example, when x is 1, the acceleration voltage may be higher than or equal to 50 keV and lower than or equal to 100 keV; when x is 2, the acceleration voltage may be higher than or equal to 100 keV and lower than or equal to 200 keV; and when x is 10, the acceleration voltage may be higher than or equal to 500 keV and lower than or equal to 1000 keV.

Further, in the case where the semiconductor substrate 110 is irradiated with the cluster ions including carbon and hydrogen, hydrogen ion irradiation to be performed later is not necessarily performed if sufficient hydrogen to form an embrittled region can be added by the cluster ion irradiation.

Furthermore, in the case where the semiconductor substrate 110 is irradiated with hydrogen ions after being irradiated with the cluster ions including carbon and hydrogen, the dose of hydrogen ions can be further reduced compared to the case in Embodiment 1. In this embodiment, the hydrogen ion irradiation can be performed, for example, with an accelerating voltage of 50 kV at a dose of $5 \times 10^{15}$ ions/$cm^2$.

Similarly to Embodiment 1, the semiconductor substrate 110 may be irradiated with the cluster ions including carbon and hydrogen either before or after forming the insulating layer 114. However, in the case where a thermal oxidation film is formed as the insulating layer 114 by performing thermal oxidation treatment on the semiconductor substrate 110, the irradiation with the cluster ions including carbon and hydrogen is performed after forming the thermal oxidation film. This is because carbon and hydrogen in the semiconductor substrate 110 are diffused by thermal oxidation treatment if the thermal oxidation treatment is performed after the irradiation with the cluster ions including carbon and hydrogen.

As described above, according to this embodiment, desorption of hydrogen added by the irradiation with the cluster ions including carbon and hydrogen, and hydrogen ions that are used for the irradiation, from the semiconductor substrate 110, can be suppressed.

Further, according to this embodiment, the SOI 190 substrate having the semiconductor layer 118 with high crystallinity can be obtained.

Furthermore, according to this embodiment, the SOI substrate 190 having the semiconductor layer 118 with less surface unevenness can be obtained.

Embodiment 3

Figure 4A:
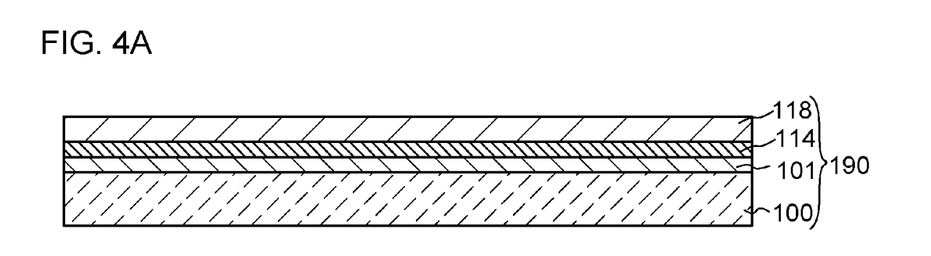
FIGS. 4A to 4D are cross-sectional views illustrating manufacturing steps of a semiconductor device.

FIG. 4A is a cross-sectional view illustrating part of the SOI substrate manufactured by the method described in Embodiments 1 and 2 (see FIG. 3C).

In order to control the threshold voltage of a thin film transistor (TFT), a p-type impurity such as boron, aluminum, or gallium, or an n-type impurity such as phosphorus or arsenic may be added to the semiconductor layer 118. A region to which the impurity is added and the kind of impurity to be added can be changed as appropriate. For example, a p-type impurity is added to a formation region of an n-channel TFT, and an n-type impurity is added to a formation region of a p-channel TFT. The above impurity elements may be added at a dose of approximately greater than or equal to $1 \times 10^{11}$ ions/cm$^2$ and lower than or equal to $1 \times 10^{14}$ ions/cm$^2$.

Figure 4B:
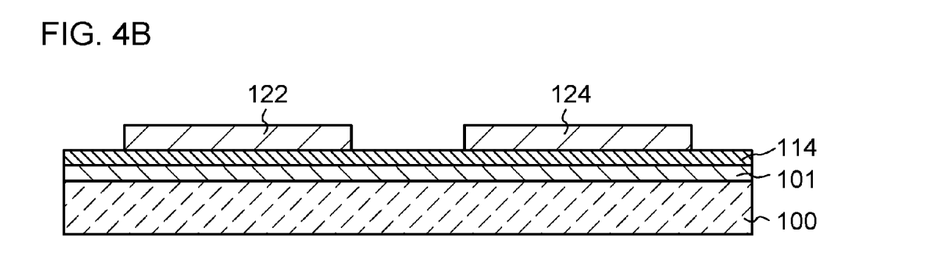

Then, the semiconductor layer 118 is divided into island shapes to form a semiconductor layer 122 and a semiconductor layer 124 (see FIG. 4B).

Figure 4C:
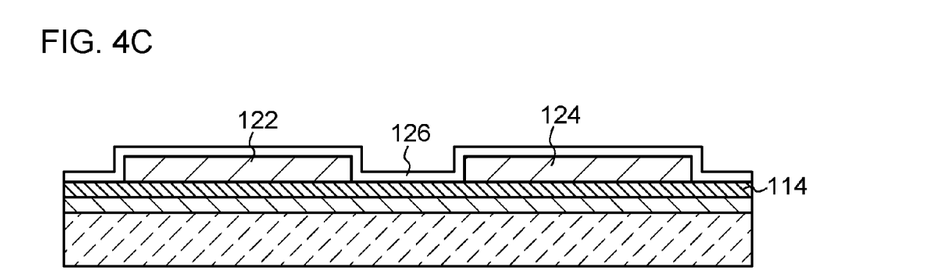

Next, an insulating film 126 is formed to cover the semiconductor layer 122 and the semiconductor layer 124 (see FIG. 4C). Here, a single-layer silicon oxide film is formed by a plasma CVD method. Instead of the silicon oxide film, a film containing silicon oxynitride, silicon nitride oxide, silicon nitride, hafnium oxide, aluminum oxide, tantalum oxide, or the like may be formed to have a single layer structure or a stack structure as the insulating film 126.

As a manufacturing method other than a plasma CVD method, a sputtering method or a method using oxidation or nitridation by high density plasma treatment can be given. High-density plasma treatment is performed using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the oxidation or nitridation of the semiconductor layers 122 and 124 by the above-described high-density plasma treatment is a solid-phase reaction, the interface state density between the insulating film 126 and each of the semiconductor layers 122 and 124 can be drastically reduced. Further, the semiconductor layers 122 and 124 are directly oxidized or nitrided using the high-density plasma treatment, whereby variation in thickness of the insulating film 126 to be formed can be suppressed. Since the semiconductor layers 122 and 124 are single crystal films, even when the surfaces of the semiconductor layers 122 and 124 are oxidized by a solid-phase reaction by using the high-density plasma treatment, the insulating film 126 with high uniformity and low interface state density can be formed. The insulating film 126 formed using the high-density plasma treatment is used for part of or the entire gate insulating film of a transistor, whereby variation in characteristics of the transistors can be suppressed.

Alternatively, a gate insulating film may be formed by thermally oxidizing the semiconductor layers 122 and 124. In the case of such thermal oxidation, it is necessary to use a glass substrate having a certain degree of heat resistance.

Note that hydrogen contained in the insulating film 126 may be diffused into the semiconductor layers 122 and 124 by performing heat treatment at a temperature of greater than or equal to 350° C. and less than or equal to 450° C. after forming the insulating film 126 containing hydrogen. In this case, the insulating film 126 can be formed using silicon nitride or silicon nitride oxide with a plasma CVD method. Further, a process temperature is preferably lower than or equal to 350° C. In this manner, hydrogen is supplied to the semiconductor layers 122 and 124, whereby defects in the semiconductor layers 122 and 124, at an interface between the insulating film 126 that is to be the gate insulating film and the semiconductor layer 122, and at an interface between the insulating layer 126 that is to be the gate insulating film and the semiconductor layer 124 can be effectively reduced.

Figure 4D:
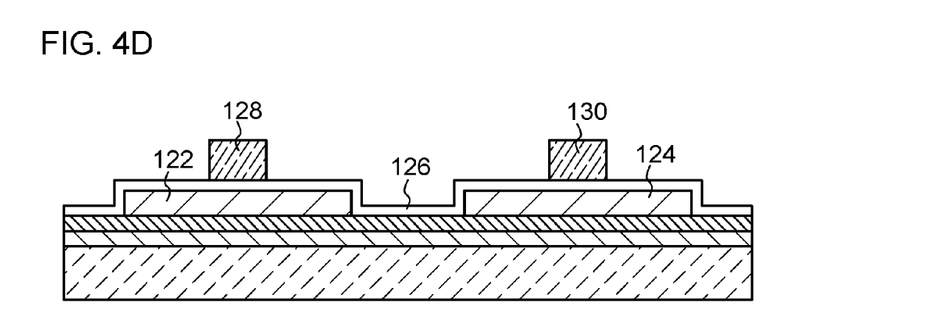

Next, a conductive film is formed over the insulating film 126, and then, the conductive film is processed (patterned) into a predetermined shape, whereby a gate electrode 128 and a gate electrode 130 are formed over the semiconductor layer 122 and the semiconductor layer 124, respectively (see FIG. 4D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material, such as polycrystalline silicon which is obtained by doping a semiconductor with an impurity element that imparts a conductivity type, may be used.

Although the gate electrodes 128 and 130 are formed using a single-layer conductive film in this embodiment, the semiconductor device according to an embodiment of the disclosed invention is not limited to this structure. The gate electrodes 128 and 130 may be formed of a plurality of conductive films which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be used.

Note that a mask used for forming the gate electrodes 128 and 130 may be formed using a material such as silicon oxide or silicon nitride oxide. In this case, a step of forming a mask by patterning a silicon oxide film, a silicon nitride oxide film, or the like is additionally needed. However, decrease in film thickness of the mask in etching is smaller than that in the case of using a resist material; thus, the gate electrodes 128 and 130 with more precise shapes can be formed. Alternatively, the gate electrodes 128 and 130 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the gate electrodes 128 and 130 can be formed by etching the conductive film to have desired tapered shapes with an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape can be adjusted by the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 5A:
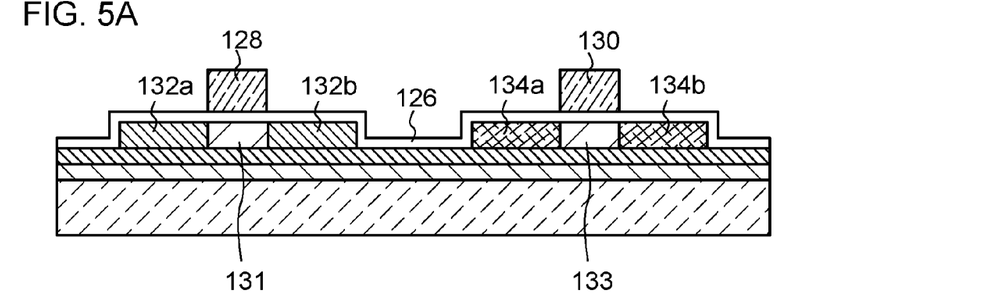
FIGS. 5A to 5D are cross-sectional views illustrating manufacturing steps of a semiconductor device.

Then, impurity elements each imparting one conductivity type are added into the semiconductor layers 122 and 124 using the gate electrodes 128 and 130 as masks (see FIG. 5A). In this embodiment, an impurity element imparting n-type conductivity (for example, phosphorus or arsenic) is added to the semiconductor layer 122, and an impurity element imparting p-type conductivity (for example, boron) is added to the semiconductor layer 124. Note that when the impurity element imparting n-type conductivity is added to the semiconductor layer 122, the semiconductor layer 124 to which the p-type impurity element is added is covered with a mask or the like so that the impurity element imparting n-type conductivity is added selectively. When the impurity element imparting p-type conductivity is added to the semiconductor layer 124, the semiconductor layer 122 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 122 and 1244, the other of the impurity element imparting p-type conductivity and the impurity element imparting n-type conductivity may be added to only one of the semiconductor layers at a higher concentration. By the addition of the impurity, impurity regions 132a and 132b are formed in the semiconductor layer 122, and impurity regions 134a and 134b are formed in the semiconductor layer 124. Further, a channel formation region 131 between the impurity regions 132a and 132b, and a channel formation region 133 between the impurity regions 134a and 134b are formed.

Figure 5B:
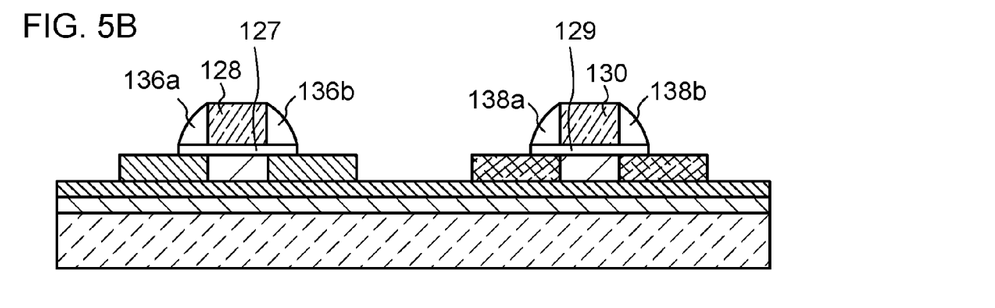

Next, a sidewall 136a and a sidewall 136b are formed on side surfaces of the gate electrode 128, and a sidewall 138a and a sidewall 138b are formed on side surfaces of the gate electrode 130 (see FIG. 5B). The sidewalls 136a and 136b and the sidewalls 138a and 138b can be formed by, for example, newly forming an insulating film so as to cover the insulating film 126 and the gate electrodes 128 and 130 and by partially etching the insulating film by anisotropic etching. A gate insulating film 127 is formed by partially etching the insulating film 126 by anisotropic etching using the gate electrode 128, and the sidewalls 136a and 136b as masks. Similarly, a gate insulating film 129 is formed by partially etching the insulating film 126 by anisotropic etching using the gate electrode 130, and the sidewalls 138a and 138b as masks.

For the insulating film used for forming the sidewalls 136a and 136b and the sidewalls 138a and 138b, a film containing silicon, silicon oxide, silicon nitride, silicon oxynitride, silicon nitride oxide, an organic material, or the like may be formed to have a single layer structure or a stacked structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that steps of forming the sidewalls 136a and 136b, and the sidewalls 138a and 138b are not limited thereto.

Next, impurity elements imparting one conductivity type are added to the semiconductor layer 122 using the gate insulating film 127, the gate electrode 128, and the sidewalls 136a and 136b as masks. Similarly, impurity elements imparting one conductivity type are added to the semiconductor layer 124 using the gate insulating film 129, the gate electrode 130, and the sidewalls 138a and 138b as masks.

Note that the impurity elements imparting the same conductivity types as the impurity elements which have been added to the semiconductor layer 122 and the semiconductor layer 124 in the previous step are added to the semiconductor layer 122 and the semiconductor layer 124 at higher concentrations than those in the previous step. Here, when the impurity element imparting n-type conductivity is added to the semiconductor layer 122, the semiconductor layer 124 to which the impurity element imparting p-type conductivity is added is covered with a mask or the like so that the impurity element imparting n-type conductivity is added selectively. When the impurity element imparting p-type conductivity is added to the semiconductor layer 124, the semiconductor layer 122 to which the impurity element imparting n-type conductivity is added is covered with a mask or the like so that the impurity element imparting p-type conductivity is added selectively.

By the addition of the impurity element, a pair of high-concentration impurity regions 140a and 140b, a pair of low-concentration impurity regions 141a and 141b, and a channel formation region 131 are formed in the semiconductor layer 122. Further, by the addition of the impurity element, a pair of high-concentration impurity regions 142a and 142b, a pair of low-concentration impurity regions 143a and 143b, and a channel formation region 133 are formed in the semiconductor layer 124. The pair of high-concentration impurity regions 140a and 140b and the pair of high-concentration impurity regions 142a and 142b each function as a source or a drain, and the low-concentration impurity regions 141a and 141b and the low-concentration impurity regions 143a and 143b each function as a lightly doped drain (LDD) region.

Note that the sidewalls 136a and 136b formed over the semiconductor layer 122 and the sidewalls 138a and 138b formed over the semiconductor layer 124 may be formed so as to have the same length or different lengths in a direction in which carriers travel (in a direction parallel to a so-called channel length). For example, the sidewalls 138a and 138b over the semiconductor layer 124 which constitutes part of a p-channel transistor 152 is preferably formed to have a longer length in the direction in which carriers move than that of each of the sidewalls 136a and 136b over the semiconductor layer 122 which constitutes part of an n-channel transistor 151. By increasing the lengths of the sidewalls 138a and 138b of the p-channel transistor 152, a short channel effect due to diffusion of boron can be suppressed; therefore, boron can be added to the source and the drain at high concentration. Accordingly, the resistance of the source region and the drain region can be sufficiently reduced.

A silicide region in which silicide is formed in part of the semiconductor layers 122 and 124 may be formed in order to further reduce the resistance of the source region and the drain region. The silicide is formed by placing a metal in contact with the semiconductor layers and causing a reaction between the metal and silicon in the semiconductor layers by heat treatment (e.g., a GRTA method, an LRTA method, or the like). For the silicide region, cobalt silicide, nickel silicide, or the like may be used. In the case where each of the semiconductor layers 122 and 124 is thin, silicide reaction may proceed to the bottoms of the semiconductor layers 122 and 124. As a metal material used for the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser beam irradiation or the like.

Figure 5C:
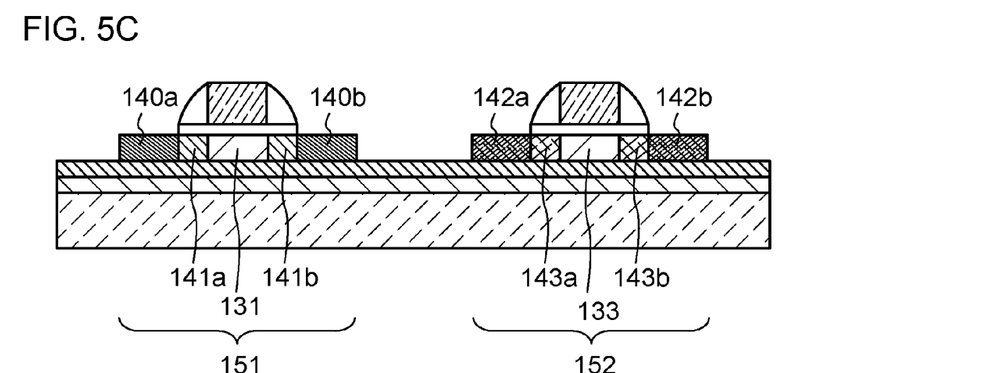

Through the aforementioned steps, the n-channel transistor 151 and a p-channel transistor 152 are formed. Note that although conductive films each serving as a source electrode or a drain electrode have not been formed at the stage in FIG. 5C, a structure including these conductive films each serving as a source electrode or a drain electrode may also be referred to as a transistor.

Subsequently, an insulating film 145 is formed to cover the n-channel transistor 151 and the p-channel transistor 152. The insulating film 145 is not necessarily provided; however, the insulating film 145 can prevent impurities such as an alkali metal and an alkaline-earth metal from entering the n-channel transistor 151 and the p-channel transistor 152. In particular, the insulating film 145 is preferably formed using a material such as silicon oxide, silicon nitride, silicon oxynitride, silicon nitride oxide, aluminum nitride, aluminum oxide, or the like. In this embodiment, a silicon nitride oxide film with a thickness of about 600 nm is used as the insulating film 145. In this case, the above-described hydrogenation step may be performed after the silicon nitride oxide film is formed. Note that although the insulating film 145 is formed to have a single layer structure in this embodiment, it is needless to say that the insulating film 145 may have a stacked structure. For example, in the case of a two-layer structure, the insulating film 145 may have a stacked structure of a silicon oxynitride film and a silicon nitride oxide film.

Figure 5D:
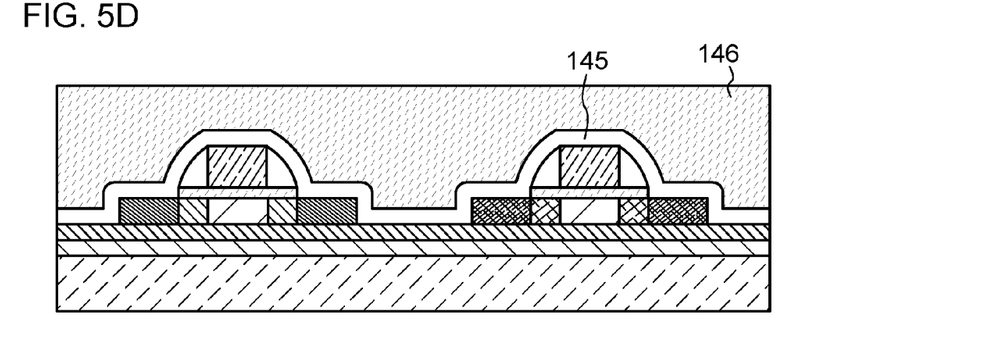

Next, an insulating film 146 is formed over the insulating film 145 to cover the n-channel transistor 151 and the p-channel transistor 152 (see FIG. 5D). The insulating film 146 may be formed using an organic material having heat resistance, such as polyimide, acrylic, benzocyclobutene, polyamide, or epoxy. Other than such an organic material, it is also possible to use a low-dielectric constant material (a low-k material), a siloxane based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Note that the insulating film 146 may be formed by stacking a plurality of insulating films formed from any of the above materials.

For the formation of the insulating film 146, the following method can be used depending on the material of the insulating film 146: a CVD method, a sputtering method, an SOG method, a spin coating method, a dip coating method, a spray coating method, a droplet discharge method (e.g., an ink-jet method, screen printing, or offset printing), or a tool (equipment) such as a doctor knife, a roll coater, a curtain coater, or a knife coater.

Figure 6:
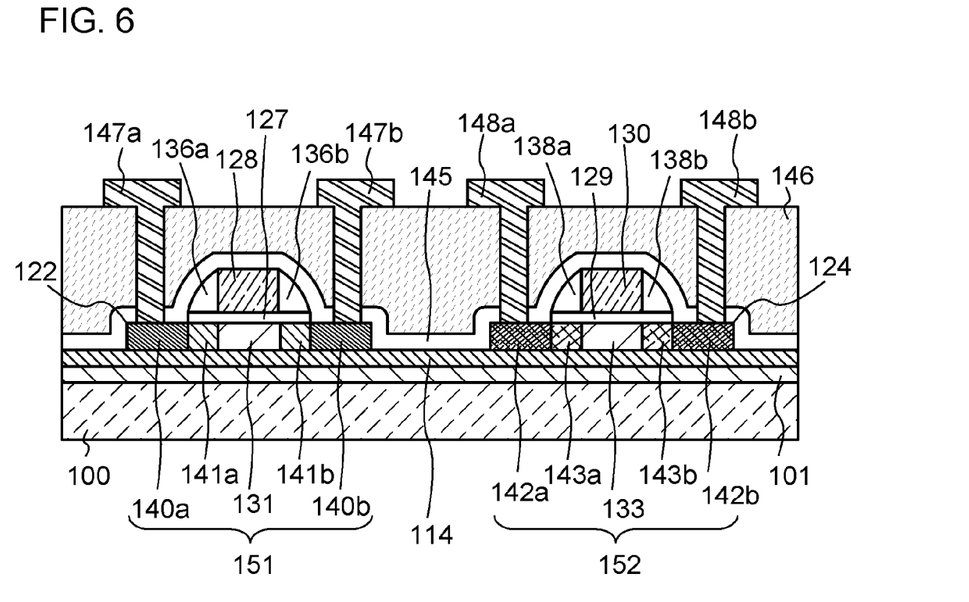
FIG. 6 is a cross-sectional view illustrating a manufacturing step of a semiconductor device.

Next, contact holes are formed in the insulating films 145 and 146 so that each of the semiconductor layers 122 and 124 is partly exposed. Conductive films 147a and 147b which are in contact with the semiconductor layer 122 through contact holes, and conductive films 148a and 148b which are in contact with the semiconductor layer 124 through contact holes are formed (see FIG. 6). The conductive films 147a and 147b serve as source and drain electrodes of the transistor. The conductive films 148a and 148b serve as source and drain electrodes of the transistor. Note that in this embodiment, as an etching gas for forming the contact holes, a mixed gas of $CHF_3$ and He is employed; however, the etching gas is not limited thereto.

The conductive films 147a, 147b, 148a, and 148b can be formed by a CVD method, a sputtering method, or the like. Specifically, as a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Further, the conductive films 147a, 147b, 148a, and 148b may have a single layer structure or a stacked structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Aluminum and aluminum silicon (Al—Si), which have low resistance and are inexpensive, are suitable as a material for forming the conductive films 147a, 147b, 148a, and 148b. In particular, aluminum silicon is preferable because generation of a hillock due to resist baking at the time of patterning (steps containing film formation and etching) can be suppressed. Further, a material in which copper (Cu) is mixed into aluminum at approximately 0.5% may be used instead of silicon.

In the case where each of the conductive films 147a, 147b, 148a, and 148b is formed to have a stacked structure, a stacked structure of a barrier film, an aluminum silicon film, and a barrier film, a stacked structure of a barrier film, an aluminum silicon film, a titanium nitride film, and a barrier film, or the like may be employed, for example. Note that the barrier film is, a film formed of titanium, titanium nitride, molybdenum, molybdenum nitride, tantalum, tantalum nitride, or the like. By forming the conductive films such that an aluminum silicon film is interposed between barrier films, generation of hillocks of aluminum or aluminum silicon can be further prevented. Moreover, by forming the barrier film using titanium that is a highly reducible element, even if a thin oxide film is formed over the semiconductor layers 122 and 124, the oxide film is reduced by the titanium contained in the barrier film, whereby preferable contact between the conductive films 147a and 147b and the semiconductor layer 122, and between the conductive films 148a and 148b and the semiconductor layer 124 can be obtained. Further, it is also possible to stack a plurality of barrier films. In that case, for example, each of the conductive films 147a, 147b, 148a, and 148b can be formed to have a five-layer structure of titanium, a titanium nitride, aluminum silicon, titanium, and a titanium nitride in order from the bottom or a stacked structure of more than five layers.

For the conductive films 147a, 147b, 148a, and 148b, tungsten silicide formed by a chemical vapor deposition method using a $WF_6$ gas and a $SiH_4$ gas may be used. Alternatively, tungsten formed by hydrogen reduction of $WF_6$ may be used as the conductive films 147a, 147b, 148a, and 148b.

Note that the conductive films 147a and 147b are respectively connected to the high-concentration impurity regions 140a and 140b of the n-channel transistor 151, and the conductive films 148a and 148b are respectively connected to the high-concentration impurity regions 142a and 142b of the p-channel transistor 152.

The n-channel transistor 151 and the p-channel transistor 152 include the gate electrode 128 and the gate electrode 130, respectively. However, one embodiment of the disclosed invention is not limited to this structure. The transistors may have a multi-gate structure in which a plurality of electrodes serving as gate electrodes are included and electrically connected to one another.

Note that the structure described in this embodiment can be used in appropriate combination with any of structures described in the other embodiment.

According to this embodiment, desorption of hydrogen ions with which the semiconductor substrate is irradiated can be suppressed, and the dose of hydrogen ions that is used for irradiation can be reduced, so that manufacturing cost of a transistor can be reduced.

Further, according to this embodiment, an SOI substrate having a semiconductor layer with less surface unevenness can be obtained, so that a transistor with improved characteristics can be obtained.

This application is based on Japanese Patent Application Serial No. 2011-005490 filed with Japan Patent Office on Jan. 14, 2011, the entire contents of which are hereby incorporated by reference.

What is claimed is:

1. A method for manufacturing an SOI substrate, comprising the steps of:

irradiating a semiconductor substrate with a carbon ion;

irradiating the semiconductor substrate with a hydrogen ion after irradiation with the carbon ion to form an embrittled region in the semiconductor substrate;

disposing a surface of the semiconductor substrate and a surface of a base substrate to face each other so that the semiconductor substrate and the base substrate are bonded; and separating the semiconductor substrate along the embrittled region to form a semiconductor layer over the base substrate, wherein a maximum value of a carbon concentration and a maximum value of a hydrogen concentration in the semiconductor substrate are located at a same depth.

2. The method for manufacturing an SOI substrate according to claim 1, wherein an insulating layer is formed over the semiconductor substrate before the semiconductor substrate is irradiated with the carbon ion.

3. The method for manufacturing an SOI substrate according to claim 1, wherein an insulating layer is formed over the semiconductor substrate after the semiconductor substrate is irradiated with the carbon ion.

4. A method for manufacturing an SOI substrate comprising the steps of:

irradiating a semiconductor substrate with a carbon ion at a dose higher than or equal to $1\times10^{14}$ ions/cm$^2$ and lower than or equal to $2\times10^{16}$ ions/cm$^2$;

irradiating the semiconductor substrate with a hydrogen ion after irradiation with the carbon ion to form an embrittled region in the semiconductor substrate;

disposing a surface of the semiconductor substrate and a surface of the base substrate to face each other so that the semiconductor substrate and the base substrate are bonded; and separating the semiconductor substrate along the embrittled region to form a semiconductor layer over the base substrate, wherein a maximum value of a carbon concentration and a maximum value of a hydrogen concentration in the semiconductor substrate are located at a same depth.

5. The method for manufacturing an SOI substrate according to claim 4, wherein an insulating layer is formed over the semiconductor substrate before the semiconductor substrate is irradiated with the carbon ion.

6. The method for manufacturing an SOI substrate according to claim 4, wherein an insulating layer is formed over the semiconductor substrate after the semiconductor substrate is irradiated with the carbon ion.

* * * * *